(12) United States Patent
Miller

(10) Patent No.: US 7,061,771 B2
(45) Date of Patent: Jun. 13, 2006

(54) MECHANISM TO CROSS HIGH-SPEED DIFFERENTIAL PAIRS

(75) Inventor: Dennis J. Miller, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 439 days.

(21) Appl. No.: 10/408,369

(22) Filed: Apr. 7, 2003

(65) Prior Publication Data

US 2004/0085741 A1    May 6, 2004

Related U.S. Application Data

(62) Division of application No. 10/288,346, filed on Nov. 4, 2002, now Pat. No. 6,930,888.

(51) Int. Cl.
 *H05K 1/18*    (2006.01)
(52) U.S. Cl. ............... 361/772; 361/778; 174/261; 333/4
(58) Field of Classification Search ........ 361/764, 361/772, 774, 777, 778, 788; 174/261–264; 439/75, 78, 931; 333/1, 4, 5, 236, 238, 246, 333/33, 34, 12, 247, 260

See application file for complete search history.

(56) References Cited

U.S. PATENT DOCUMENTS

| 3,761,842 | A | * | 9/1973 | Gandrud ................ 333/1 |
| 5,047,895 | A | * | 9/1991 | Sasaki ................ 361/749 |
| 5,357,051 | A | | 10/1994 | Hwang |
| 5,432,485 | A | | 7/1995 | Nagashima |
| 5,459,284 | A | | 10/1995 | Bockelman et al. |
| 5,646,368 | A | | 7/1997 | Muyshondt et al. |
| 5,717,556 | A | * | 2/1998 | Yanagida ............... 361/803 |
| 6,057,512 | A | * | 5/2000 | Noda et al. ............ 174/250 |
| 6,396,000 | B1 | * | 5/2002 | Baum ................ 174/261 |
| 6,445,204 | B1 | | 9/2002 | He et al. |
| 6,514,090 | B1 | * | 2/2003 | Neal et al. .............. 439/75 |

FOREIGN PATENT DOCUMENTS

DE        29923524       11/2000

* cited by examiner

*Primary Examiner*—Kamand Cuneo
*Assistant Examiner*—Thanh S. Phan
(74) *Attorney, Agent, or Firm*—Blakely, Sokoloff, Taylor & Zafman LLP

(57) ABSTRACT

According to one embodiment, a printed circuit board (PCB) is disclosed. The PCB includes a first functional unit block (FUB) and differential traces coupled to the first FUB. The first FUB transmits high-speed serial data. The differential traces carry the high-speed serial data from the first FUB. In addition, the differential traces crossover on the same layer of the PCB while maintaining a constant impedance.

30 Claims, 2 Drawing Sheets

MECHANISM TO CROSS HIGH-SPEED DIFFERENTIAL PAIRS

The present patent application is a Divisional of application Ser. No. 10/288,346, filed Nov. 4, 2002 now U.S. Pat. No. 6,930,888.

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to printed circuit boards (PCBs); more particularly, the present invention relates to routing differential pairs on a PCB.

BACKGROUND

Recently, there has been a trend among hardware designers to implement serial interfaces between hardware components. Serial interfaces are high-speed point-to-point interfaces between box-to-box, board-to-board, or chip-to-chip interfaces. Serial interfaces reduce interconnect complexity, wires and space compared to parallel interfaces. Serial interfaces operate according to a differential mode wherein differential mode signals propagate through a pair of traces. One trace carries a conventional signal, while the other trace carries a signal that is exactly equal and opposite.

Often, the layout of the pin assignments of the interfaced components calls for the traces to be switched at the receiving component. Typically, the traces are crossed over on another layer of the printed circuit board (PCB) in order to maintain impedance matching between the traces. However, swapping the traces on different PCB layers increases the costs of manufacturing a PCB having integrated circuits and differential traces.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A method for crossing high-speed differential pairs is described. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
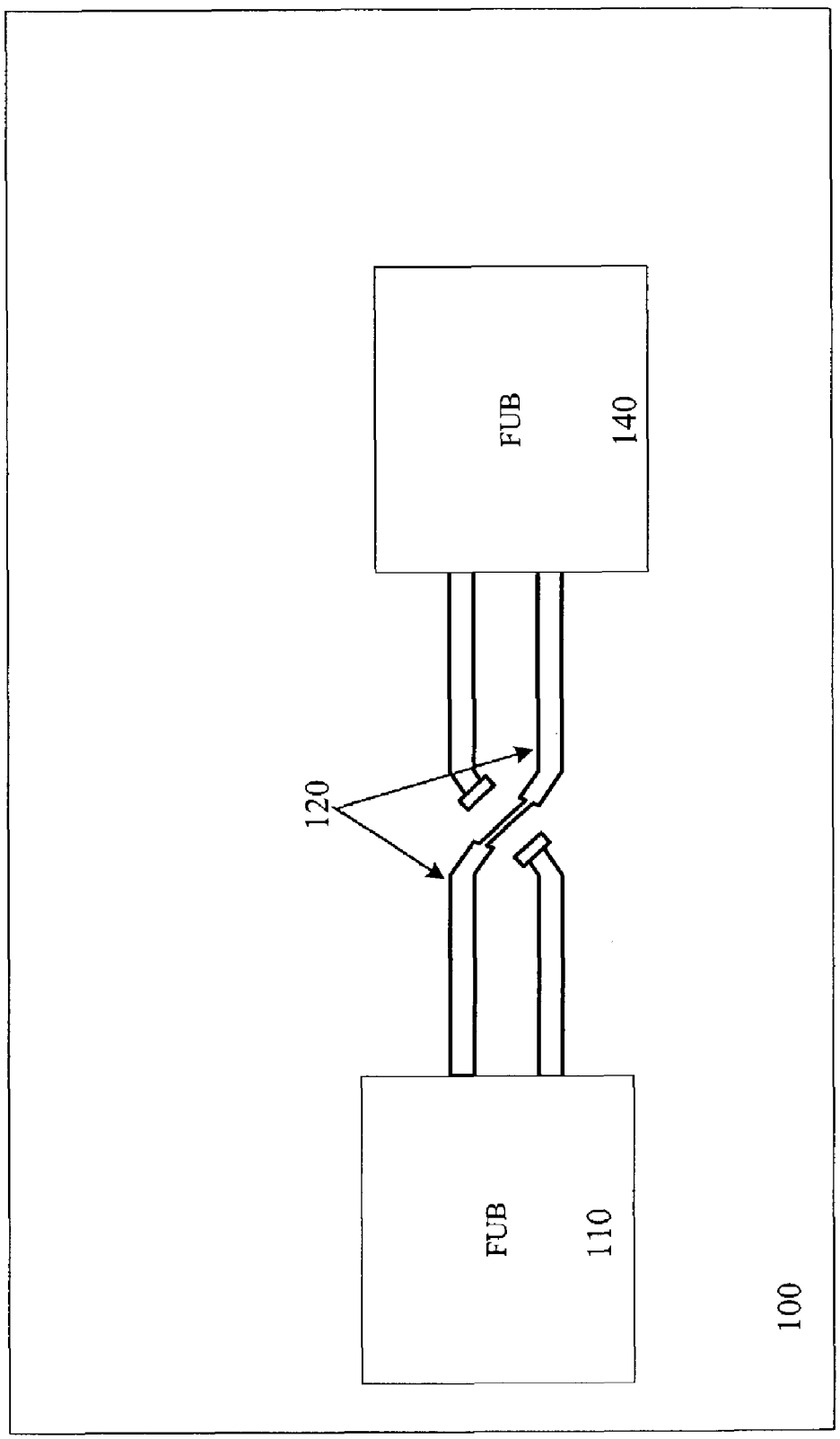
FIG. 1 illustrates one embodiment of a printed circuit board.

FIG. 1 illustrates one embodiment of a printed circuit board (PCB) 100. PCB 100 is a thin plate on which integrated circuits and other electronic components are located. PCB 100 includes functional unit block (FUB) 110, differential traces 120, and FUB 140.

In one embodiment, FUB 110 is an integrated circuit chip that includes logic circuitry that may encompass various components (e.g., microprocessor logic, micro-controller logic, memory logic, etc.). In a further embodiment, FUB 110 transmits high-speed (e.g., microwave) serial data. FUB 110 transmits the serial data and the complement of the data to FUB 140 via differential traces 120. In one embodiment, FUB 110 serializes the data prior to transmission. However, in other embodiments, the data may be serialized prior to being received at FUB 110.

Traces 120 are coupled to FUB 110. In one embodiment, traces 120 are complementary traces that transmit differential mode signals. One trace 120 carries a typical high-speed signal, while the other trace 120 carries a signal that is exactly equal and opposite. FUB 140 is coupled to traces 120. FUB 140 is also an integrated circuit chip that includes logic circuitry that may encompass various components.

In one embodiment, FUB 140 receives high-speed serial data. FUB 140 receives the serial data and the complement of the data from FUB 110 via complementary traces 120. In a further embodiment, FUB 140 de-serializes the data after receiving the data. However, in other embodiments, the data may be de-serialized after being transmitted from FUB 140.

In some instances, the layout of the pin assignments on FUB 110 and FUB 140 may necessitate that traces 120 be switched at the FUB 140 connection. Typically, complementary traces are designed in such a way that the characteristic impedance of the traces is constant everywhere along the trace. In laying out the differential pairs, the traces should be identical. Accordingly, the traces should have identical impedance and should be of identical length.

During crossover of the traces to accommodate pin assignments, one trace is typically crossed over on another layer of the PCB in order to maintain impedance matching between the traces. After the crossover, the trace is brought back to the same level and is connected to a FUB or connector.

According to one embodiment, traces 120 are designed to crossover on the same layer of PCB 100 while maintaining a constant impedance.

Figure 2:
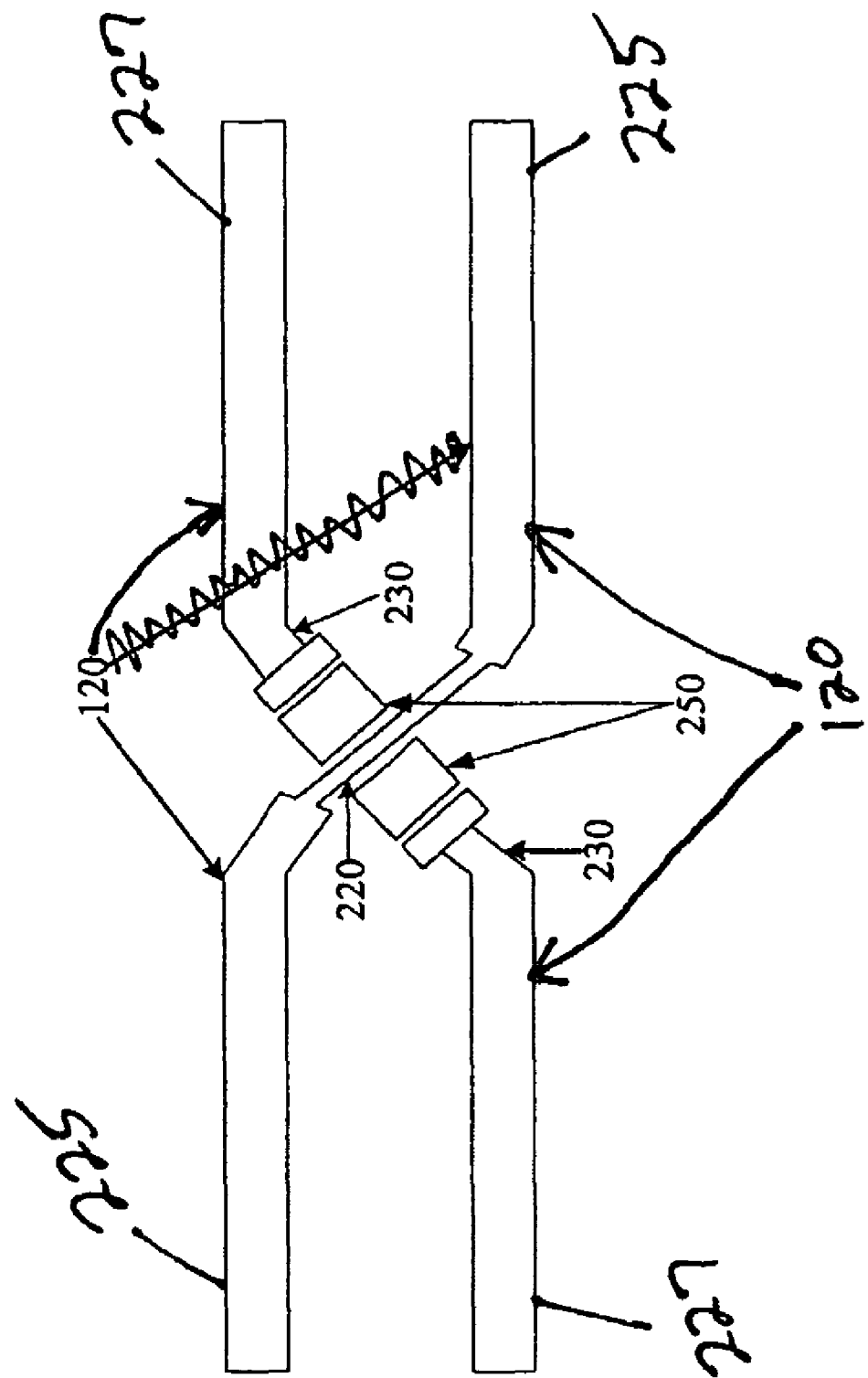
FIG. 2 illustrates one embodiment of differential traces.

FIG. 2 illustrates one embodiment of differential traces 120. Traces 120 include a passing trace 225 and a non-passing trace 227. Passing trace 225 includes a crossover section 220, while non-passing trace 227 includes narrow widths 230. In addition, a component 250 is coupled between the passing trace 225 and the non-passing trace 227. In one embodiment, component 250 is a passive component such as a capacitor. Also, other passive components, such as a resistor, may be implemented as component 250.

According to one embodiment, the cross over section 220 of the passing trace 225 crosses the non-passing trace 227 at a right angle to component 250 in order to minimize cross talk. In addition, the narrow widths 230 of the non-passing trace 227 compensate for the higher dielectric constant provided by component 250. As a result a constant impedance is maintained as the traces 120 are crossed over.

The present invention enables the swapping of positions of the two halves of a differential pair without having to use vias to route signals to another layer of a PCB in order to maintain the proper impedance. Thus, very high frequency surface traces may be crossed without significant signal degradation.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A system comprising:
   a first printed circuit board (PCB); and
   a second PCB, coupled to the first PCB via differential traces, the differential traces to carry the high-speed serial data received from a first logic element on the first PCB to a second logic element on the second PCB, a first of the differential traces crossing through a second of the differential traces in a non-continuous area of the second differential trace within a same layer of the second PCB while maintaining a constant impedance.

2. The system of claim 1 wherein the first differential trace is a passing trace and the second differential trace is a non-passing trace.

3. The system of claim 2 wherein the passing trace crosses the non-passing trace at a right angle.

4. The system of claim 3 wherein the non-passing trace has a narrow section that compensates for the dielectric constant of passive components.

5. The system of claim 2 further comprising a component coupled between the passing trace and the non-passing trace.

6. The system of claim 5 wherein the component is a resistor.

7. The system of claim 5 wherein the component is a capacitor.

8. The system of claim 5, wherein the non-passing trace includes a narrow section to compensate for a dielectric constant of the component.

9. The system of claim 2, wherein the non-passing trace includes a narrow section to maintain the constant impedance.

10. The system of claim 1, wherein at least one of the differential traces includes a narrow section to maintain the constant impedance.

11. A system comprising:
    a first functional unit block (FUB) that transmits high-speed serial data;
    differential traces, coupled to the first FUB, that carry the high-speed serial data from the first FUB, a first of the differential traces crossing through a second of the differential traces in a non-continuous area of the second differential trace within a same layer of a printed circuit board (PCB) while maintaining a constant impedance; and
    a second FUB, coupled to the differential traces, to receive the high-speed serial data from the differential traces.

12. The system of claim 11 wherein the first differential trace is a passing trace and the second differential trace is a non-passing trace.

13. The system of claim 12 wherein the passing trace crosses the non-passing trace at a right angle.

14. The system of claim 12 further comprising a component coupled between the passing trace and the non-passing trace.

15. The system of claim 14 wherein the component is a resistor.

16. The system of claim 14 wherein the component is a capacitor.

17. The system of claim 14, wherein the non-passing trace includes a narrow section to compensate for a dielectric constant of the component.

18. The system of claim 12 wherein the non-passing trace has a narrow section that compensates for the dielectric constant of passive components.

19. The system of claim 12, wherein the non-passing trace includes a narrow section to maintain the constant impedance.

20. The system of claim 11, wherein at least one of the differential traces includes a narrow section to maintain the constant impedance.

21. A method comprising transmitting high-speed serial data from a first logic element via differential traces having a first differential trace crossing through a second differential trace in a non-continuous area of the second differential trace within a same layer of a printed circuit board (PCB) to a second logic element while maintaining a constant impedance.

22. The method of claim 21 wherein the first differential trace is a passing trace and the second differential trace is a non-passing trace.

23. The method of claim 22 wherein the passing trace crosses the non-passing trace at a right angle.

24. The method of claim 22 further comprising a component coupled between the passing trace and the non-passing trace.

25. The method of claim 24 wherein the non-passing trace has a narrow section that compensates for the dielectric constant of passive components.

26. The method of claim 24, wherein the non-passing trace includes a narrow section that compensates for a dielectric constant of the component.

27. The method of claim 24, further comprising compensating for a dielectric constant of the component.

28. The method of claim 24, further comprising maintaining the constant impedance by compensating for a dielectric constant of the component.

29. The method of claim 22, wherein the non-passing trace includes a narrow section that maintain the constant impedance.

30. The method of claim 21, wherein at least one of the differential traces includes a narrow section that maintains the constant impedance.

* * * * *